Figure 1:
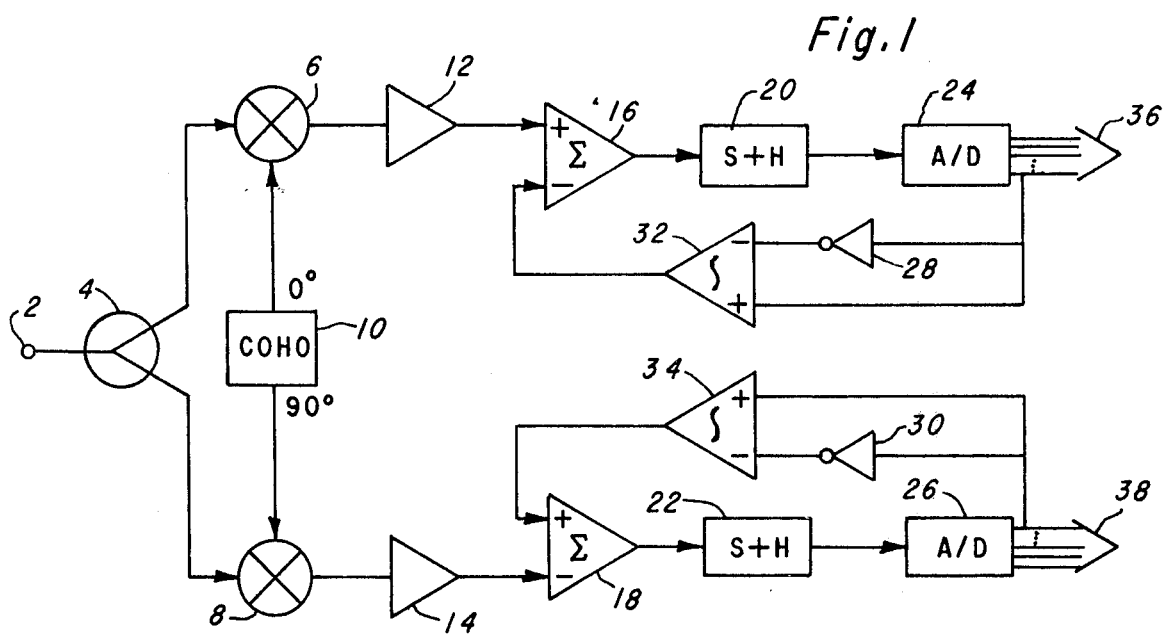

United States Patent [19]

Couvillon

[11] 3,953,805
[45] Apr. 27, 1976

[54] DC COMPONENT SUPPRESSION IN ZERO CF IF SYSTEMS

[75] Inventor: James Benedict Couvillon, Dallas, Tex.

[73] Assignee: Texas Instruments Incorporated, Dallas, Tex.

[22] Filed: Nov. 7, 1974

[21] Appl. No.: 521,721

[52] U.S. Cl. ................................. 328/162; 328/165
[51] Int. Cl.² ........................................... H04B 1/12
[58] Field of Search ........... 328/133, 162, 163, 165, 328/151; 178/DIG. 26, 7.3 DC, 7.5 DC

[56] References Cited
UNITED STATES PATENTS

| 3,636,462 | 1/1972 | Baldauf, Jr. ..................... 328/162 X |
| 3,654,560 | 4/1972 | Cath et al. ..................... 328/162 X |

Primary Examiner—John Zazworsky
Attorney, Agent, or Firm—Harold Levine; Rene' E. Grossman; Alva H. Bandy

[57] ABSTRACT

Disclosed is a zero center frequency IF system having an all digital complex multiplier in which DC components in the IF signals are removed from an A/D converter output. Any DC level which reaches the input of the A/D converter or any misalignment in the A/D converter causes the digital outputs to contain unequal numbers of positive and negative words. The sign bit of the digital output is coupled to the input of an integrator which generates a DC output proportional to the DC offset in the A/D converter output. The integrator output is substracted from the IF signal coupled to the input of the A/D converter and cancels any DC components present.

5 Claims, 2 Drawing Figures

DC COMPONENT SUPPRESSION IN ZERO CF IF SYSTEMS

This invention relates to electrical signal processing systems and more particularly to systems which sequentially sample an analog signal having an average value of zero and generate digital representations of the sampled signal.

Receivers with zero intermediate frequency are commonly used in moving target indicating, pulse compression, spread spectrum, pulse Doppler and Doppler clutter tracking systems. Typically the intermediate frequency signals in a zero center frequency system are two video signals which are related instantaneously by a 90° phase difference. Simultaneous sampling of these two signals, which are called the I (in phase or cosine) and Q (quadrature phase or sine) signals, allows complete determination of the phase and amplitude of the intermediate frequency, IF, signal in each sampling cycle. IF returns from ground clutter, rain clouds, chaff, and water have random phase and therefore should produce I and Q signals at zero center frequency IF which contain no average DC component.

With the improved speed and decreased size and cost of modern digital electronics the use of all digital processing in such systems is becoming increasingly more important. Digital complex multipliers allow a digital system to perform previous "all analog" functions such as frequency translation and matched filter operations. The proper operation of a complex multiplier requires that the input signals have no DC components. If a DC component is present the cross multiplication of the I and Q signals produces unwanted outputs. These unwanted complex multiplier outputs generate amplitude modulation, phase modulation, time side lobes or harmonics, depending upon the system application. While the actual received signals generate no DC components in the zero intermediate frequency signal, the receiver itself does generate DC components. For example, diode and transformer imbalances produce DC components in the outputs of the synchronous detectors which provide the in phase and quadrature signals. The detector outputs are low level and must be amplified thereby increasing the magnitude of any DC error in the detector output. The present practice is to AC couple the output of such an amplifier to a sample and hold circuit for the purpose of removing any DC component. Since the systems operate with zero center frequency, the AC signals being coupled from the DC amplifiers are generally very low frequency and require large coupling capacitors which have significant leakages that result in more DC errors. The AC coupled signal is then normally fed to a sample and hold circuit which provides DC outputs for an analog to digital converter. It is normally assumed that the sample and hold circuit and the analog to digital converter contribute no DC errors since these can be zeroed out initially. In practice both the sample and hold circuits and the A/D converter tend to drift with temperature and time thus adding DC errors back into the system.

Accordingly an object of the present invention is to provide improved means for suppressing DC components in zero center frequency IF systems.

Another object of the present invention is to provide means for removing DC component errors from the outputs of digital to analog converters in signal processing systems which convert analog signals having zero average value to digital data.

The above and other objects are achieved by providing a bi-directional integrator having its input coupled to the sign bit output of an analog to digital converter and by coupling the integrator to a summing amplifier which adds the integrator output to the analog signal input to the analog to digital converter. Since a digital representation of an analog signal having zero average value contains an equal number of positive and negative words, when averaged over many samples, the integrator output remains zero as long as no DC errors are present in the system. Any DC errors cause unequal numbers of positive and negative words and the integrator output changes proportionally to cancel out the errors.

Figure 2:
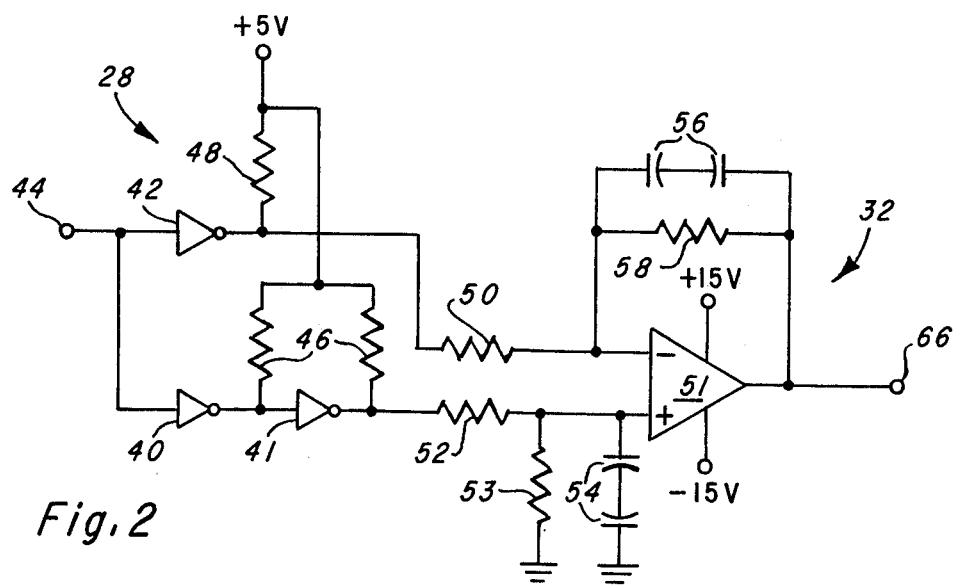

Other objects, features and advantages of this invention will become better understood by reference to the following detailed description when read in conjunction with the accompanying drawings wherein:

FIG. 1 is a block diagram of that portion of a zero intermediate frequency system which generates in phase and quadrature digital representations of a receiver input signal; and FIG. 2 is an electrical schematic diagram of the error feedback loop of the system of FIG. 1.

The preferred embodiment of the present invention is illustrated in terms of its use in a moving target indication radar system. A general discussion of this type of radar systems is found in the text "Radar Systems" by Merrill I. Skolnik, published by McGraw-Hill Book Company, 1962. The operation of MTI radars is based upon a doppler shift principle. For a fixed position MTI radar system, stationary ground clutter causes no doppler shift of radar signals reflected from these clutter targets. Any moving target does cause a doppler shift in the echo signal. Received return pulses are mixed with a stable local oscillator, stalo, to generate an intermediate frequency signal. The intermediate frequency signal is then amplified and detected in a phase detector or mixer havig another input from a coherent oscillator, coho, having the same frequency as non-doppler shifted return signal. The prior art systems as described in the above-referenced text at pp. 113–118, couple the phase detected IF signal to a delay line canceller to indicate the moving targets.

The MTI radar system of the preferred embodiment detects moving targets when the system itself is moving with respect to ground clutter or when the clutter, such as clouds and chaff, is moving. The preferred embodiment of the present invention illustrated in FIG. 1 generates guadrature channels from the IF signal to provide digital inputs for a complex multiplier of correlation receiver in place of the prior art delay line canceller. The complex multiplier is used to translate the frequency of the IF signal by an amount equal to the clutter frequency so that clutter appears at zero doppler frequency and only the desired small moving targets are tracked. The speed of modern digital complex multipliers allows a separate frequency translation for each range bin. The amplified IF signal is coupled through an input 2 to signal splitter 4 which splits the input signal into two identical in-phase signals. One of these signals is coupled to an input of a synchronous detector 6 and the other to an input of a synchronous detector 8. A coherent oscillator, coho, 10 has two outputs phase shifted by 90° with respect to each other. The zero degree output is coupled to the other input of detector 6 and the 90° phase shifted output is coupled to the other input of detector 8. The output of detector 6 is therefore in phase with the receiver IF signal at input 2 and is termed th I Video. The output of detector 8 is 90° out of phase with the receiver IF signal at input 2 and is termed the Quadrature of Q Video. The I Video and Q Video are amplified by DC amplifiers 12 and 14, respectively. The outputs of amplifiers 12 and 14 are each coupled to an input of summing amplifiers 16 and 18, respectively. The outputs of summing amplifiers 16 and 18 are coupled to the sampling inputs of sample and hold circuits 20 and 22, respectively. The outputs of sample and hold circuits 20 and 22 are coupled to the inputs of 2's compliment analog to digital converters 24 and 26 such as, for example, AIM AD-120 manufactured by Precision Monolitics, Inc. The outputs of A/D converters 24 and 26 are a plurality of digital bits representing both the sign and the amplitude of the analog input. All of the digital output bits appear at outputs 36 and 38 for coupling to a complex multiplier. (not shown) The sign bit outputs of converters 24 and 26 are also coupled to error feedback loops comprising inverters 28 and 30 and integrators 32 and 34, respectively. These error feedback loops are described in greater detail below. The error feedback signals from integrators 32 and 34 are fed to second inputs of summing amplifiers 16 and 18, respectively.

The operation of the I Video channel and the Q Video channel are identical and will be described for the I Video channel only for simplicity. The receiver IF signal at input 2 contains clutter frequencies at or near the coho 10 frequency and doppler frequencies generated by moving targets. Signal splitter 4 simply couples a portion of this input signal to synchronous detector 6. In detector 6, the coho zero degree output is mixed with the receiver IF signal with the result that the I Video signal contains the doppler frequency signals generated by moving clutter, if any, and those generated by moving targets. Although the signal at this point is theoretically a pure AC signal, the detector 6 is never in reality perfectly balanced and the I Video signal does contain some DC signal components. DC amplifier 12 amplifies both the AC doppler signals and a DC error signal and may additionally add more DC error to the signal. Any DC error coupled from DC amplifier 12 through summing amplifier 16 will be sampled along with the actual AC amplitude when sample and hold gate 20 receives a trigger signal from a range bin clock. (Not shown) The effect of the DC error will be an unequal numer of positive and negative words at the output of A/D converter 24. The sign bit output of A/D converter 24 is coupled directly to one input of integrator 32 and through inverter 28 to the other polarity input and causes integrator 32 output to ramp up or down in response to the sign of the digital word. An inequality in the number of positive and negative words will cause the integrator 32 output to slowly ramp in the proper direction to cancel the DC error appearing at the output of the A/D converter 24. The location of this feedback loop is such that even if a DC error is caused by amplifier 16, sample and hold circuit 20, or the A/D converter 24 itself the DC input level will be shifted enough to offset the error. Thus, the output of summing amplifier 16 may not have precisely zero average value when digital output 36 does have zero average value.

The error feedback loop comprising inverter 28 and integrator 32 is illustrated in more detail in FIG. 2. The sign bit output of A/D converter 24 is coupled to input 44. Two cascaded inverters 40, 41 couple the sign bit from input 44 to the non-inverting input of the integrator shown generally at 32. Inverters 40, 41 are used in place of the direct connection of the A/D conerter 24 sign bit output to the integrator 32 non-inverting input illustrated in FIG. 1. Pull up resistors 46 provide loads for the outputs of inverters 40 and 41. Inverter 42 inverts the sign bit at input 44 and drives the inverting input of integrator 32. Pull up resistor 48 provides a load for inverter 42. Inverters 40, 41 and 42 may be for example, Texas Instruments Incorporated type Sn 5405. Bidirectional integrator 32 is a classical operational amplifier integrator comprising an operational amplifier 51 having resistive inputs and capacitive feedback. Operational amplifier 51 may be, for example, a National Semiconductor Incorporated, type LM 101A. An input resistor 50 couples the output of inverter 42 to the inverting input of amplifier 51. Capacitors 56 provide capacitive feedback from the output of the amplifier 51 to the inverting input. A feedback resistor 58 connected from the output to the non-inverting input of amplifier 51 provides long term DC stabilization of the integrator output and limits gain. An input resistor 52 couples the output of inverter 41 to the non-inverting input of amplifier 51. Capacitors 54 in combination with resistor 53 provide an input impedance at the non-inverting input matching that at the inverting input of amplifier 51. Resistor 53 and capacitors 54 also insure common mode operation of amplifier 51 by providing an input reference voltage midway between the two output voltage levels of inverter 41. The inverters 40, 41, and 42 are all produced on a single integrated circuit device so that the reference generated by inverter 41 is also midway between the two output voltage levels of inverter 42 over time and temperature. The integral of the sign bit inputs appears at output 66 to be coupled to an inverting input of summing amplifier 16 of FIG. 1.

In operation the feedback loop of FIG. 2 provides a slowly varying error signal which has no substantial effect on signal from sample to sample. Over a long term the error signal does cancel DC components generated by aging and thermal changes.

Although the present invention has been shown and illustrated in terms of specific apparatus, it is apparent that changes can be made within the spirit and scope of the present invention as defined by the appended claims.

What is claimed is:
1. A signal processing system comprising:
 a. a receiver means for receiving an AC signal having an average zero value,
 b. an analog to digital converter coupled to the receiver means for receiving as an input the AC signal of the receiver means for providing digital representations including positive and negative sign bit outputs of the received signal,
 c. error detection means coupled to said analog to digital converter for providing an error signal proportional to the difference between the number of positive and negative sign bit outputs, and
 d. summing means coupled to the error detection means for adding the error signal to the analog to digital converter AC signal input whereby the difference between the numbers of positive and negative sign bit outputs is reduced substantially to zero.

2. A signal processing system according to claim 1 wherein said error detection means is a bidirectional integrator having its input coupled to the sign bit of the analog to digital converter output for providing an analog output proportional to DC signal errors which generate unequal numbers of positive and negative sign bits.

3. A signal processing system according to claim 2 wherein said summing means is a summing amplifier having one input coupled to said receiver means and a second input connected to the bidirectional integrator output, and an output coupled to said analog to digital converter input, whereby said summing amplifier couples said receiver means to said analog to digital converter input and adds said error signal to said analog to digital converter input.

4. A signal processing system according to claim 3 including a sample and hold circuit having an input connected to said summing means output and an output connected to said analog to digital converter input for sequentially sampling the summing amplifier output and reproducing the sampled value at the analog to digital converter input.

5. In a signal processing system of the class wherein an analog signal having an average value of zero is sampled by a sample and hold circuit and the stored samples are converted to a digital signal including a sign bit by an analog to digital converter, the improvement comprising an integrator coupled to the converter sign bit output, and summing means for adding the integrator output to the input to the sample and hold circuit, whereby circuit imbalances in the system which cause unequal numbers of positive and negative digital outputs are cancelled.

* * * * *